United States Patent
Choi et al.

(10) Patent No.: US 8,604,500 B2
(45) Date of Patent: Dec. 10, 2013

(54) LIGHT EMITTING DEVICE AND LIGHT EMITTING DEVICE PACKAGE

(75) Inventors: Hyun Min Choi, Seoul (KR); Sun Kyung Kim, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 52 days.

(21) Appl. No.: 13/031,825

(22) Filed: Feb. 22, 2011

(65) Prior Publication Data

US 2011/0227111 A1   Sep. 22, 2011

(30) Foreign Application Priority Data

Mar. 17, 2010   (KR) .................. 10-2010-0023736

(51) Int. Cl.
*H01L 33/46*   (2010.01)
*B82Y 20/00*   (2011.01)

(52) U.S. Cl.
USPC .................. 257/98; 257/E33.06; 977/832

(58) Field of Classification Search
USPC .................. 257/98, E33.06, 72, 99
See application file for complete search history.

(56) References Cited

U.S. PATENT DOCUMENTS

| | | | |
|---|---|---|---|
| 7,682,854 B2 | 3/2010 | Yoo | 438/29 |
| 2005/0016583 A1* | 1/2005 | Blieske et al. | 136/256 |
| 2005/0040427 A1* | 2/2005 | Sugawara et al. | 257/103 |
| 2006/0163596 A1* | 7/2006 | Kim et al. | 257/98 |
| 2009/0155580 A1* | 6/2009 | Shibata et al. | 428/336 |
| 2009/0242924 A1 | 10/2009 | Lin et al. | 257/99 |
| 2010/0133529 A1* | 6/2010 | Taraschi et al. | 257/43 |
| 2010/0314651 A1* | 12/2010 | Lin | 257/98 |

FOREIGN PATENT DOCUMENTS

| | | |
|---|---|---|
| JP | 2008-141015 A | 6/2008 |
| JP | 2009-123909 A | 6/2009 |
| KR | 10-2004-0063128 A | 7/2004 |
| KR | 10-2006-0120947 A | 11/2006 |
| KR | 10-0691123 B1 | 2/2007 |
| KR | 10-2008-0041888 A | 5/2008 |
| KR | 10-0843788 B1 | 6/2008 |
| KR | 10-0856251 B1 | 8/2008 |
| KR | 10-2009-0112854 A | 10/2009 |
| KR | 10-2010-0026458 A | 3/2010 |
| KR | 10-2010-00123686 A | 11/2010 |
| WO | WO 2009/123936 A2 | 10/2009 |

OTHER PUBLICATIONS

Korean Office Action dated Jan. 3, 2011 issued in Application No. 10-2010-0023736.

* cited by examiner

*Primary Examiner* — Whitney T Moore
(74) *Attorney, Agent, or Firm* — KED & Associates, LLP

(57) ABSTRACT

Provided are a light emitting device and a light emitting device package. The light emitting device includes a transparent substrate, a light emitting structure, and a first reflection layer. The light emitting structure includes a first conductive type semiconductor layer, an active layer, and a second conductive type semiconductor layer that are disposed on a top surface of the substrate. The first reflection layer is disposed on a bottom surface of the substrate. The bottom surface of the substrate has a surface roughness of about 1 nm to about 15 nm in root mean square (RMS) value.

20 Claims, 6 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. 119 and 35 U.S.C. 365 to Korean Patent Application No. 10-2010-0023736 (filed on Mar. 17, 2010), which is hereby incorporated by reference in its entirety.

BACKGROUND

The present disclosure relates to a light emitting device and a light emitting device package.

Light emitting diodes (LED) are semiconductor devices that convert electric energy into light. LEDs are more advantageous in many respects such as low power consumption, a semi-permanent life cycle, a fast response time, safety, and eco-friendly characteristics than light sources of the related art such as a fluorescent lamp and an incandescent bulb. Many studies have been conducted to replace existing light sources with LEDs, and LEDs are being increasingly used as light sources of lighting devices such as indoor and outdoor lamps, liquid crystal displays, electronic boards, and streetlights.

SUMMARY

Embodiments provide a light emitting device having improved light emitting efficiency.

In one embodiment, a light emitting device including: a transparent substrate; a light emitting structure including a first conductive type semiconductor layer, an active layer, and a second conductive type semiconductor layer that are disposed on a top surface of the substrate; and a first reflection layer on a bottom surface of the substrate, wherein the bottom surface of the substrate has a surface roughness of about 1 nm to about 15 nm in root mean square (RMS) value.

In another embodiment, a light emitting device including: a conductive support member; a second reflection layer on the conductive support member; an ohmic contact layer disposed on the second reflection layer and having a rough bottom surface; and a light emitting structure including a first conductive type semiconductor layer, an active layer, and a second conductive type semiconductor layer that are disposed on the ohmic contact layer, wherein the bottom surface of the ohmic contact layer has a surface roughness in a range from about 1 nm, to about 5 nm in RMS value.

In further another embodiment, a light emitting device package including: a body part; first and second electrode layers on the body part; and a light emitting device electrically connected to the first and second electrode layers, wherein the light emitting device includes the light emitting device.

Therefore, embodiments provide a light emitting device having improved light emitting efficiency.

The details of one or more embodiments are set forth in the accompanying drawings and the description below. Other features will be apparent from the description and drawings, and from the claims.

DETAILED DESCRIPTION OF THE EMBODIMENTS

Figure 1:
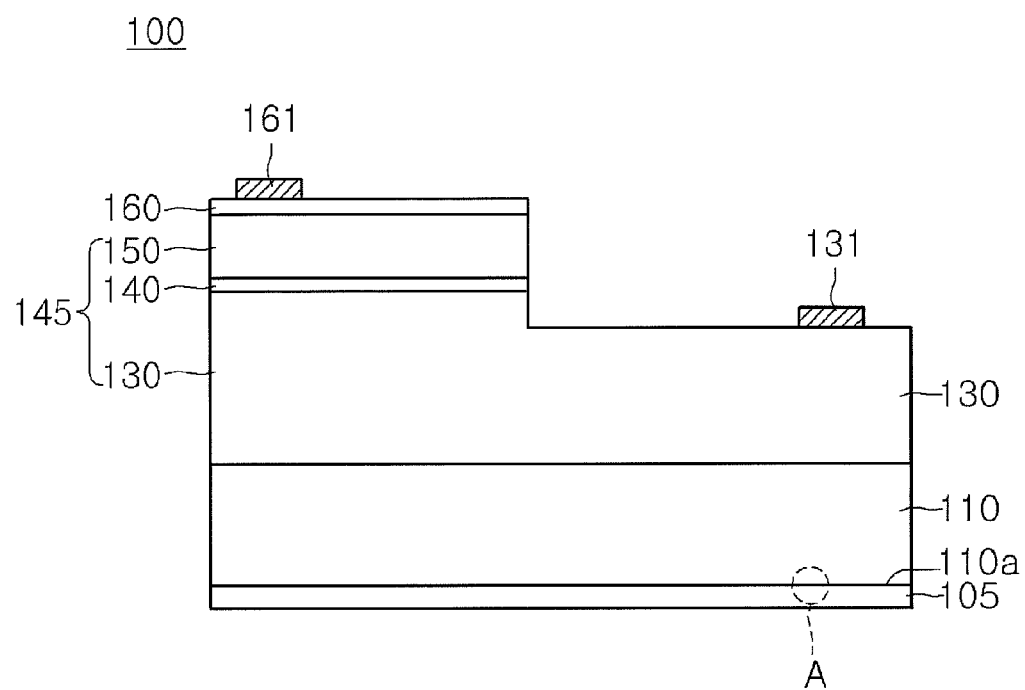
FIG. 1 is a sectional view illustrating a light emitting device according to a first embodiment.

In the descriptions of embodiments, it will be understood that when a layer (or film), a region, a pattern, or a structure is referred to as being on a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, with reference to the accompanying drawings, a light emitting device and a light emitting device package will be described according to exemplary embodiments.

First Embodiment

Figure 2:
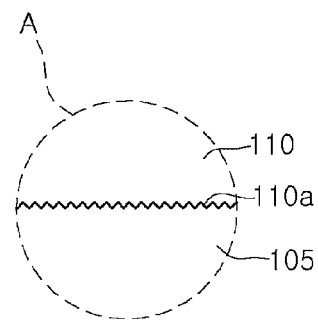
FIG. 2 is an enlarge view of portion A of FIG. 1.

FIG. 1 is a sectional view illustrating a light emitting device 100 according to a first embodiment, and FIG. 2 is an enlarged view of portion A of FIG. 1.

Referring to FIGS. 1 and 2, the light emitting device 100 may include a first reflection layer 105, a transparent substrate 110 disposed on the first reflection layer 105, a light emitting structure 145 disposed on the transparent substrate 110 to generate light, and first and second electrodes 131 and 161 configured to supply power 161 to the light emitting structure 145.

The transparent substrate 110 is a growth substrate on which the light emitting structure 145 grows. For example, the transparent substrate 110 may be formed of a material such as $Al_2O_3$ (sapphire), GaN, ZnO, and AlN.

The light emitting structure 145 includes a plurality of compound semiconductor layers that generate light from electricity received through the first and second electrodes 131 and 161 by recombination of electrons and holes. For example, the light emitting structure 145 may be formed of a compound semiconductor material having a compositional formula of $In_xAl_yGa_{1-x-y}N$ ($0 \leq x \leq 1$, $0 \leq y \leq 1$, $0 \leq x+y \leq 1$).

For example, the light emitting structure 145 may include a first semiconductor layer 130, an active layer 140 on the first semiconductor layer 130, and a second conductive type semiconductor layer 150 on the active layer 140.

The first semiconductor layer 130 is formed of a first conductive type semiconductor layer. The first semiconductor layer 130 may further include an undoped semiconductor layer under the first conductive type semiconductor layer. However, the first semiconductor layer 130 is not limited thereto.

For example, the first conductive type semiconductor layer may include an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN, and AlInN. The n-type semiconductor layer may be doped with an n-type dopent such as Si, Ge, and Sn.

The undoped semiconductor layer may be provided to improve crystallization of the first conductive type semiconductor layer. The undoped semiconductor layer may be the same as the first conductive type semiconductor layer except that the undoped semiconductor layer has a very low conductivity because it is not doped.

The active layer 140 may include a semiconductor material including a compositional formula of InxAlyGa1-x-yN ($0 \leq x \leq 1$, $0 \leq y \leq 1$, $0 \leq x+y \leq 1$). The active layer 140 may have one of a single quantum well structure, a multi quantum well (MQW) structure, a quantum wire structure, and a quantum dot structure.

If the active layer 140 has a quantum well structure, the active layer 140 may have a single or multi quantum well structure including a well layer of InxAlyGa1-x-yN ($0 \leq x \leq 1$, $0 \leq y \leq 1$, $0 \leq x+y \leq 1$) and a barrier layer of InaAlbGa1-a-bN ($0 \leq a \leq 1$, $0 \leq b \leq 1$, $0 \leq a+b \leq 1$). The well layer may be formed of a material having an energy band gap smaller than that of the barrier layer.

The active layer 140 may emit light by using energy generated during recombination of electrons and holes received from the first semiconductor layer 130 and the second conductive type semiconductor layer 150.

For example, the second conductive type semiconductor layer 150 may be realized by a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN, and AlInN. The second conductive type semiconductor layer 150 may be doped with a p-type dopant such as Mg, Zn, Ca, Sr, and Ba.

The first electrode 131 may be formed on the first semiconductor layer 130, and the second electrode 161 may be formed on the second conductive type semiconductor layer 150, to supply power to the light emitting structure 145. The first and second electrodes 131 and 161 may include at least one of aluminum (Al), titanium (Ti), chromium (Cr), nickel (Ni), copper (Cu), and gold (Au).

A transparent electrode layer 160 may be further disposed between the second electrode 161 and the light emitting structure 145. The transparent electrode layer 160 may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO.

Light generated by the active layer 140 of the light emitting structure 145 may exit from the light emitting structure 145 through the top and side surfaces of the light emitting device 100. A concave-convex or rough structure (not shown) may be formed on the top surface and/or the side surfaces of the light emitting device 100 to improve light extraction efficiency.

Light emitted downward from the light emitting structure 145 and passing through the first semiconductor layer 130 and the transparent substrate 110 has to be reflected to the top or side surfaces of the light emitting device 100 so that the light can exit to the outside of the light emitting device 100.

In the embodiment, the first reflection layer 105 is provided to efficiently reflect light emitting from the light emitting structure 145 to the outside of the light emitting device 100.

The first reflection layer 105 may be formed on a bottom surface 110a of the transparent substrate 110 entirely or partially by a deposition or plating method. The first reflection layer 105 may be formed to a thickness of several micrometers (μm) or more.

As shown in FIG. 2, the bottom surface 110a of the transparent substrate 110 may be roughened.

Ideally, when the bottom surface 110a of the transparent substrate 110 is perfectly smooth (surface roughness is zero), the reflection efficiency of an interface between the transparent substrate 110 and the first reflection layer 105 may be highest.

However, practically, the bottom surface 110a of the transparent substrate 110 is somewhat rough, and although the bottom surface 110a of the transparent substrate 110 is polished by a polishing apparatus, its surface roughness is at least several nanometers (nm).

In the embodiment, a material of the first reflection layer 105 is selectively determined according to the surface roughness of the bottom surface 110a of the transparent substrate 110 and the wavelength range of light output from the light emitting structure 145.

Figure 3:
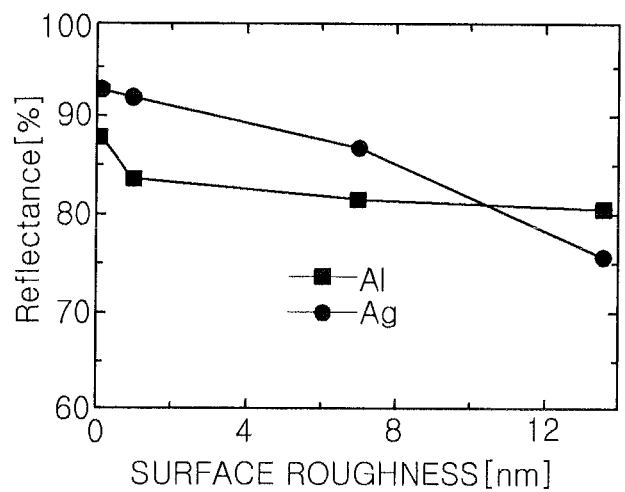
FIG. 3 is a graph illustrating results of an experiment carried out to measure reflection efficiency with respect to the surface roughness of a transparent substrate when the wavelength of light output from a light emitting structure of the light emitting device of FIG. 1 was in the range of about 380 nm to about 520 nm.
Figure 4:
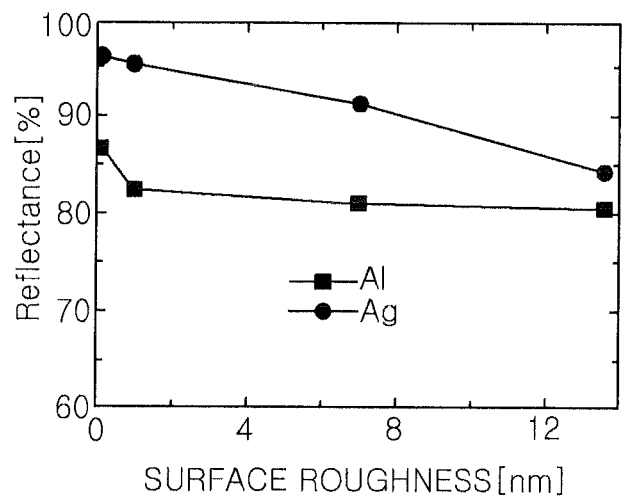
FIG. 4 is a graph illustrating results of an experiment carried out to measure reflection efficiency with respect to the surface roughness of a transparent substrate when the wavelength of light emitted from the light emitting structure of the light emitting device of FIG. 1 was in the range of about 520 nm to about 700 nm.

FIG. 3 is a graph illustrating results of an experiment carried out to measure reflection efficiency with respect to the surface roughness of the transparent substrate 110 when the wavelength of light emitted from the light emitting structure 145 was in the range of about 380 nm to about 520 nm, and FIG. 4 is a graph illustrating results of an experiment carried out to measure reflection efficiency with respect to the surface roughness of the transparent substrate 110 when the wavelength of light emitted from the light emitting structure 145 was in the range of about 520 nm to about 700 nm.

In the experiments, a sapphire ($Al_2O_3$) substrate was used as the transparent substrate 110, and the surface roughness of the transparent substrate 110 was measured in root mean square (RMS) value by using a surface roughness measuring device.

Referring to FIG. 3, when the wavelength of light emitted from the light emitting structure 145 is in the range from about 380 nm to about 520 nm and the surface roughness of the bottom surface 110a of the transparent substrate 110 is in the range from about 1 nm to about 10 nm, the reflection efficiency of the first reflection layer 105 is higher when the first reflection layer 105 includes silver (Ag) than when the first reflection layer 105 includes aluminum (Al). When the first reflection layer 105 includes silver (Ag), the reflectance of the first reflection layer 105 is almost about 80% or higher in the wavelength range of about 380 nm to about 520 nm.

On the other hand, when the wavelength of light emitted from the light emitting structure 145 is in the range from about 380 nm to about 520 nm and the surface roughness of the bottom surface 110a of the transparent substrate 110 is in the range from about 11 nm to about 15 nm, the reflection efficiency of the first reflection layer 105 is higher when the first reflection layer 105 includes aluminum (Al) than when the first reflection layer 105 includes silver (Ag). In this case, when the first reflection layer 105 includes aluminum (Al), the reflectance of the first reflection layer 105 is almost about 80% or higher in the wavelength range of about 380 nm to about 520 nm.

Referring to FIG. 4, when the wavelength of light emitted from the light emitting structure 145 is in the range from about 520 nm to about 700 nm, regardless of the surface roughness of the bottom surface 110a of the transparent substrate 110, the reflection efficiency of the first reflection layer 105 is higher when the first reflection layer 105 includes silver (Ag) than when the first reflection layer 105 includes aluminum (Al). Here, when the first reflection layer 105 includes silver (Ag), the reflectance of the first reflection layer 105 is almost about 85% or higher in the wavelength range of about 520 nm to about 700 nm. Particularly, when the surface roughness of the bottom surface 110a of the transparent substrate 110 is in the range from about 1 nm to about 8 nm, the reflectance of the first reflection layer 105 is almost about 90% or higher in the wavelength range of about 520 nm to about 700 nm.

According to the results of the experiments, a material for the first reflection layer 105 may be selected from one of silver (Ag) and aluminum (Al) which results in higher reflectance according to the wavelength range of light output from the light emitting structure 145 and the surface roughness of the bottom surface 110a of the transparent substrate 110.

In a method of manufacturing a light emitting device according to an embodiment, the bottom surface of a substrate may be roughened before or after compound semiconductor layers are grown, and a first reflection layer may be formed on the bottom surface of the substrate after the compound semiconductor layers are grown.

Second Embodiment

Figure 5:
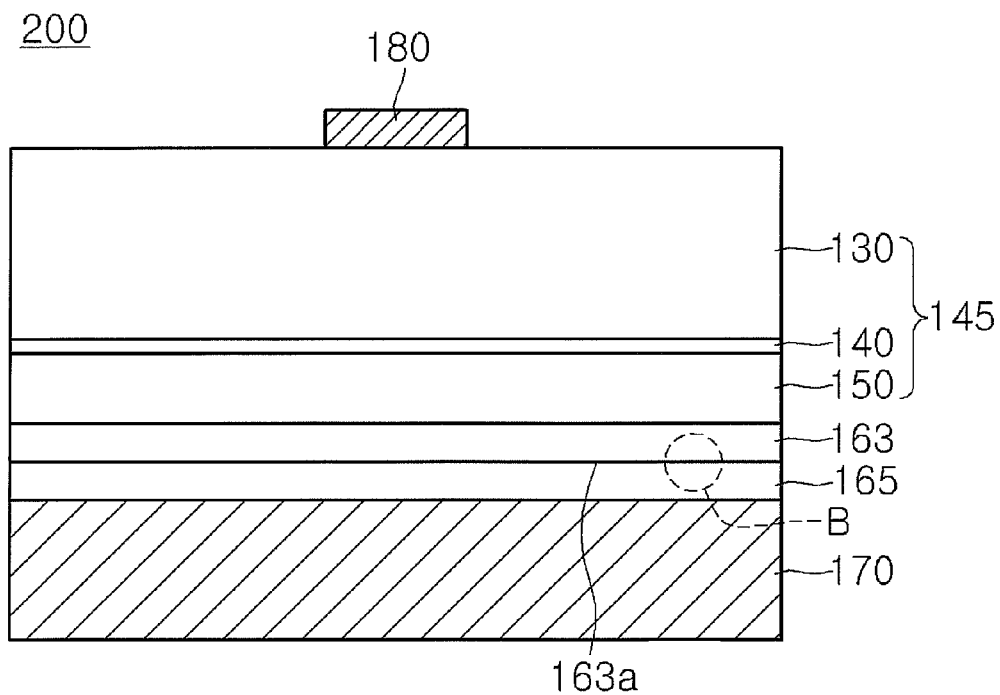
FIG. 5 is a sectional view illustrating a light emitting device according to a second embodiment.
Figure 6:
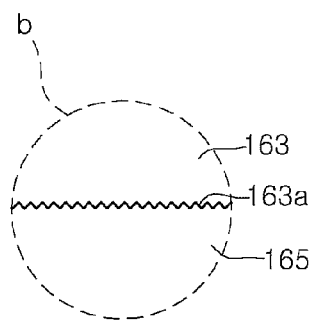
FIG. 6 is an enlarged view of portion B of FIG. 5.

FIG. 5 is a sectional view illustrating a light emitting device 200 according to a second embodiment, and FIG. 6 is an enlarged view of portion B of FIG. 5.

Referring to FIGS. 5 and 6, the light emitting device 200 may include a conductive support member 170, a second reflection layer 165 on the conductive support member 170, an ohmic contact layer 163 on the second reflection layer 165, a light emitting structure 145 on the ohmic contact layer 163, and a third electrode 180.

The conductive support member 170 supports the light emitting structure 145 and is used to supply power to the light emitting device 200 together with the third electrode 180.

The conductive support member 170 may include at least one of titanium (Ti), chromium (Cr), nickel (Ni), aluminum (Al), platinum (Pt), gold (Au), tungsten (W), copper (Cu), molybdenum (Mo), and a carrier wafer (formed of a material such as Si, Ge, GaAs, ZnO, SiC, SiGe, and GaN).

Light emitted from the light emitting structure 145 and passing through the ohmic contact layer 163 is reflected by the second reflection layer 165 to the outside of the light emitting device 100.

Since the conductive support member 170 is generally formed of an opaque material, the light emitting efficiency of the light emitting device 100 can be improved by forming the second reflection layer 165 between the conductive support member 170 and the light emitting structure 145.

For example, the conductive support member 170 may be formed by a deposition method such as sputtering, plasma-enhanced chemical vapor deposition (PECVD), and E-beam deposition. However, the method of forming the conductive support member 170 is not limited thereto.

The ohmic contact layer 163 may be provided to form an ohmic contact between the second reflection layer 165 and the light emitting structure 145.

For example, the ohmic contact layer 163 may be formed of a transparent ohmic contact material such as ITO, IZO (In—ZnO), GZO (Ga—ZnO), AZO (Al—ZnO), AGZO (Al—Ga ZnO), IGZO (In—Ga ZnO), IrOx, RuOx, and RuOx/ITO. Alternatively, the ohmic contact layer 163 may be formed of an ohmic metal such as Ni, Pt, Ir, Rh, and Ag. In this case, the ohmic contact layer 163 may be formed to a very thin thickness less than about several nanometers (nm), and thus the ohmic contact layer 163 may be substantially transparent.

For example, the ohmic contact layer 163 may be formed by a deposition method such as sputtering, PECVD, and E-beam deposition. However, the method of forming the ohmic contact layer 163 is not limited thereto.

As shown in FIG. 6, the bottom surface 163a of the ohmic contact layer 163 may be roughened. Since the rough bottom surface 163a of the ohmic contact layer 163 is located between the second reflection layer 165 and the ohmic contact layer 163, the reflection efficiency of the second reflection layer 165 may be affected by the rough bottom surface 163a.

The rough bottom surface 163a of the ohmic contact layer 163 is formed while the ohmic contact layer 163 is deposited, and the surface roughness of the rough bottom surface 163a may be determined by, for example, a deposition apparatus, a deposition method, and a deposition thickness.

In the embodiment, a material of the second reflection layer 165 is selectively determined according to the surface roughness of the bottom surface 163a of the ohmic contact layer 163 and the wavelength range of light output from the light emitting structure 145.

Figure 7:
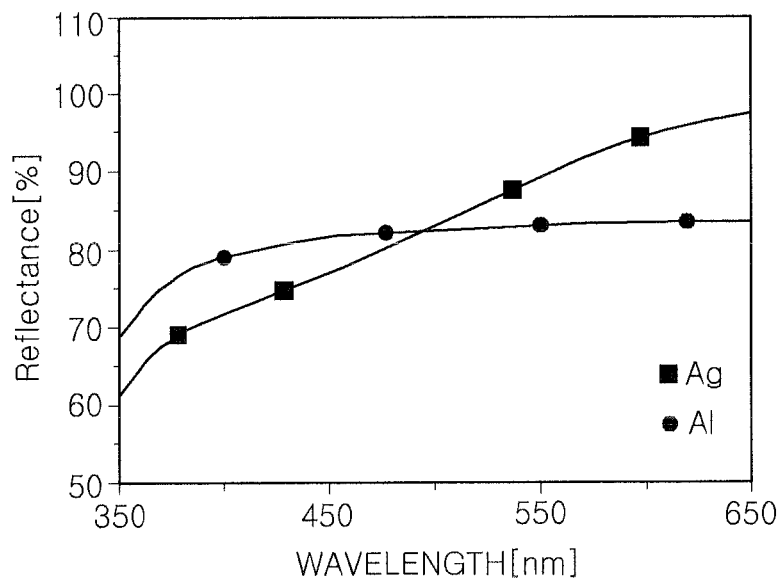
FIG. 7 is a graph illustrating results of an experiment carried out to measure reflection efficiency with respect to the wavelength range of light emitted from a light emitting structure of the light emitting device of FIG. 5 when the surface roughness of an ohmic contact layer of the light emitting device was in the range of about 1 nm to about 3 nm in RMS value.
Figure 8:
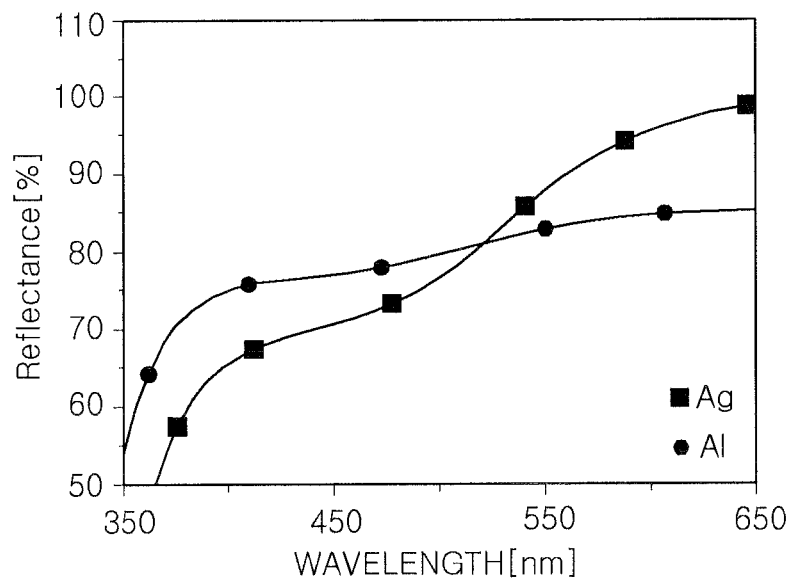
FIG. 8 is a graph illustrating results of an experiment carried out to measure reflection efficiency with respect to the wavelength range of light output from the light emitting structure of the light emitting device of FIG. 5 when the surface roughness of the ohmic contact layer of the light emitting device was in the range of about 3 nm to about 5 nm in RMS value.

FIG. 7 is a graph illustrating results of an experiment carried out to measure reflection efficiency with respect to the wavelength range of light output from the light emitting structure 145 when the surface roughness of the ohmic contact layer 163 was in the range of about 1 nm to about 3 nm in RMS value, and FIG. 8 is a graph illustrating results of an experiment carried out to measure reflection efficiency with respect to the wavelength range of light output from the light emitting structure 145 when the surface roughness of the ohmic contact layer 163 was in the range of about 3 nm to about 5 nm in RMS value.

In the experiment, the ohmic contact layer 163 was formed of ITO (Indium-Tin-Oxide).

In addition, the ohmic contact layer 163 was formed by an E-beam deposition method. If the ohmic contact layer 163 is formed to a thickness of about 80 nm to about 120 nm, for example, about 100 nm, the surface roughness of the ohmic contact layer 163 may be adjusted to be in the range from about 1 nm to about 3 nm in RMS value. If the ohmic contact layer 163 is formed to a thickness of about 180 nm to about 220 nm, for example, about 200 nm, the surface roughness of the ohmic contact layer 163 may be adjusted to be in the range from about 3 nm to about 5 nm in RMS value. That is, the surface roughness of the ohmic contact layer 163 may be increased according to the thickness of the ohmic contact layer 163.

Referring to FIG. 7, when the surface roughness of the rough bottom surface 163a of the ohmic contact layer 163 is in the range of about 1 nm to about 3 nm in RMS value and the wavelength of light emitted from the light emitting structure 145 is in the range from about 350 nm to about 500 nm, the reflection efficiency of the second reflection layer 165 is higher when the second reflection layer 165 includes aluminum (Al) than when the second reflection layer 165 includes silver (Ag). In this case, when the second reflection layer 165 includes aluminum (Al), the reflectance of the second reflection layer 165 is almost about 75% or higher in the wavelength range of about 400 nm to about 650 nm.

On the other hand, when the surface roughness of the rough bottom surface 163a of the ohmic contact layer 163 is in the range of about 1 nm to about 3 nm in RMS value and the wavelength of light emitted from the light emitting structure 145 is in the range from about 500 nm to about 650 nm, the reflection efficiency of the second reflection layer 165 is higher when the second reflection layer 165 includes silver (Ag) than when the second reflection layer 165 includes aluminum (Al). In this case, the reflectance of the second reflection layer 165 is almost about 80% or higher.

Referring to FIG. 8, when the surface roughness of the rough bottom surface 163a of the ohmic contact layer 163 is in the range of about 3 nm to about 5 nm in RMS value and the wavelength of light emitted from the light emitting structure 145 is in the range from about 350 nm to about 500 nm, the reflection efficiency of the second reflection layer 165 is higher when the second reflection layer 165 includes aluminum (Al) than when the second reflection layer 165 includes silver (Ag). In this case, the reflectance of the second reflection layer 165 is almost about 75% or higher in the wavelength range of about 400 nm to about 650 nm.

On the other hand, when the surface roughness of the rough bottom surface 163a of the ohmic contact layer 163 is in the range of about 3 nm to about 5 nm in RMS value and the wavelength of light emitted from the light emitting structure 145 is in the range from about 530 nm to about 650 nm, the reflection efficiency of the second reflection layer 165 is higher when the second reflection layer 165 includes silver (Ag) than when the second reflection layer 165 includes aluminum (Al). At this time, the reflectance of the second reflection layer 165 is almost about 80% or higher.

According to the results of the experiments, a material for the second reflection layer 165 may be selected from one of silver (Ag) and aluminum (Al) which results in higher reflectance according to the wavelength range of light output from the light emitting structure 145 and the surface roughness of the bottom surface 163a of the ohmic contact layer 163.

The light emitting structure 145 has the same structure as that of the first embodiment. Thus, a detailed description thereof will not be repeated. However, the light emitting structure 145 may have a reversed structure as compared with that of the light emitting structure 145 of the first embodiment. That is, the light emitting structure 145 may include a second conductive type semiconductor layer 150, an active layer 140 on the second conductive type semiconductor layer 150, and a first semiconductor layer 130 on the active layer 140.

The third electrode 180 may be formed on the light emitting structure 145 to supply power to the light emitting structure 145. The third electrode 180 may be formed of the same material as that used to form the first and second electrodes 131 and 161 of the first embodiment.

<Light Emitting Device Package>

Figure 9:
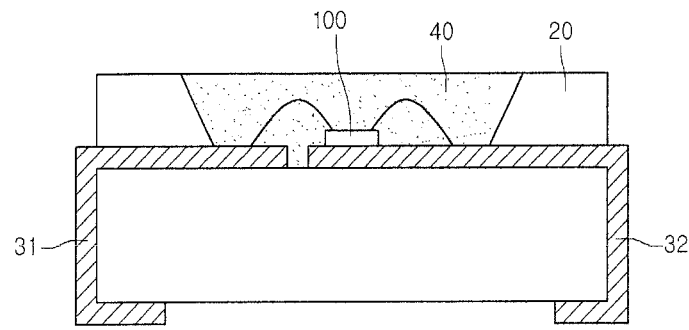
FIG. 9 is a sectional view illustrating a light emitting device package including a light emitting device according to an embodiment.

FIG. 9 is a sectional view illustrating a light emitting device package including the light emitting device 100 according to an embodiment.

Referring to FIG. 9, the light emitting device package of the current embodiment includes: a body part 20; first and second electrode layers 31 and 32 disposed on the body part 20; the light emitting device 100 of the previous embodiment disposed on the body part 20 and electrically connected to the first and second electrode layers 31 and 32; and a molding member 40 enclosing the light emitting device 100.

The body part 20 may be formed of a silicon material, a synthetic resin material, or a metal material. Also, a sloped surface may be disposed around the light emitting device 100.

The first and second electrode layers 31 and 32 are electrically separated from each other to supply power to the light emitting device 100. In addition, the first and second electrode layers 31 and 32 may reflect light emitted from the light emitting device 100 to improve optical efficiency and may dissipate heat generated from the light emitting device 100 the outside.

The light emitting device 100 may be disposed on the body part 20 or the first or second electrode layer 31 or 32.

In FIG. 9, a wiring method is used to electrically connect the light emitting device 100 to the first and second electrode layers 31 and 32. However, the connection method is not limited thereto. For example, the light emitting device 100 may be electrically connected to the first and second electrode layers 31 and 32 through a flip chip method or a die bonding method.

The molding member 40 may surround the light emitting device 100 to protect the light emitting device 100. In addition, a phosphor may be contained in the molding member 40 to change the wavelength of light emitted from the light emitting device 100.

At least one of the light emitting devices of the above-described embodiments may be mounted in one or plurality on the light emitting device package. However, the light emitting device package is not limited thereto.

A plurality of light emitting devices or light emitting device packages of the embodiments may be arrayed on a substrate. Optical members such as a light guide panel (LGP), a prism sheet, and a diffusion sheet may be disposed on optical paths of the light emitting device packages. The light emitting device packages, the substrate, and the optical members may function as a light unit. The semiconductor light emitting devices or the light emitting device packages of the above-described embodiments may be used in a display, an indicator, or a lighting system according to another embodiment. Examples of the light system include a lamp, a streetlight, an electronic board, and a headlamp of a vehicle.

Figure 10:
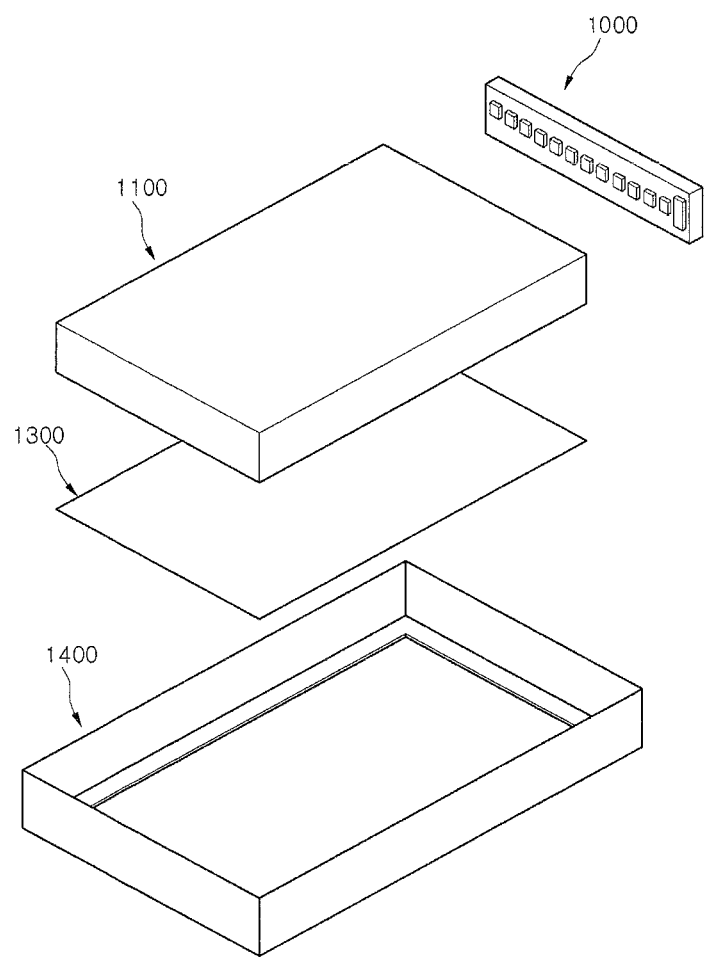
FIG. 10 is a view illustrating a backlight unit using light emitting device according to an embodiment.

FIG. 10 is a view illustrating a backlight unit using light emitting devices according to an embodiment. The backlight unit of FIG. 10 is an example of light units. That is, the spirit and scope of the present disclosure is not limited thereto.

Referring to FIG. 10, the backlight unit may include a bottom cover 1400, a light guide member 1100 disposed within the bottom cover 1400, and a light emitting module 1000 disposed on at least one side surface or the bottom surface of the light guide member 1100. Also, a reflection sheet 1300 may be disposed under the light guide member 1100.

The bottom cover 1400 may have a box shape with an opened top side to receive the light guide member 1100, the light emitting module 1000, and the reflective sheet 1300. The bottom cover 1400 may be formed of a metal material or a resin material, but is not limited thereto.

The light emitting module 1000 may include a substrate and a plurality of light emitting device packages of the embodiment. The light emitting device packages may be disposed on the substrate. The light emitting device packages of the embodiment may provide light to the light guide member 1100.

As shown in FIG. 10, the light emitting module 1000 may be disposed on at least one of inner side surfaces of the bottom cover 1400. Thus, the light emitting module 1000 may provide light toward the inner side surface of the light guide member 1100.

Alternatively, the light emitting module 1000 may be disposed on the bottom surface of the bottom cover 1400 to provide light toward the bottom surface of the light guide member 1100. This may be variously varied according to the design of the backlight unit. That is, the spirit and scope of the present disclosure is not limited thereto.

The light guide member 1100 may be disposed within the bottom cover 1400. The light guide member 1100 may receive light from the light emitting module 1000 and guide the light to a display panel (not shown) as surface light.

In the case where the light emitting module 1000 is disposed on a side surface of the light guide member 1100, the light guide member 1100 may be a light guide panel (LGP).

The LGP may be formed of an acryl-based resin such as polymethylmethacrylate (PMMA) or one of polyethylene terephthlate (PET), poly carbonate (PC), cyclic olefin copolymer (COC), and polyethylene naphthalate (PEN).

In the case where the light emitting module 1000 is disposed on the bottom surface of the light guide member 1100, the light guide member 1100 may include at least one of an LGP or an optical sheet.

For example, the optical sheet may include at least one of a diffusion sheet, a condensing sheet, and a brightness enhancement sheet. For example, the optical sheet may be formed by sequentially stacking such a diffusion sheet, a condensing sheet, and a brightness enhancement sheet. In this case, the diffusion sheet may uniformly diffuse light output from the light emitting module 1000, and the diffused light may be condensed on a display panel (not shown) by the condensing sheet. Here, light output through the condensing sheet is randomly polarized light. The brightness enhancement sheet may enhance polarization of the light output through the condensing sheet. For example, the condensing sheet may be a horizontal and/or vertical prism sheet. Also, the brightness enhancement sheet may be a dual brightness enhancement film.

The reflection sheet 1300 may be disposed under the light guide member 1100. The reflection sheet 1300 may reflect light emitted through the bottom surface of the light guide member 1100 toward a light exit surface of the light guide member 1100.

The reflection sheet 1300 may be formed of a resin material having a high reflectance such as PET, PC, and PVC, but is not limited thereto.

Figure 11:
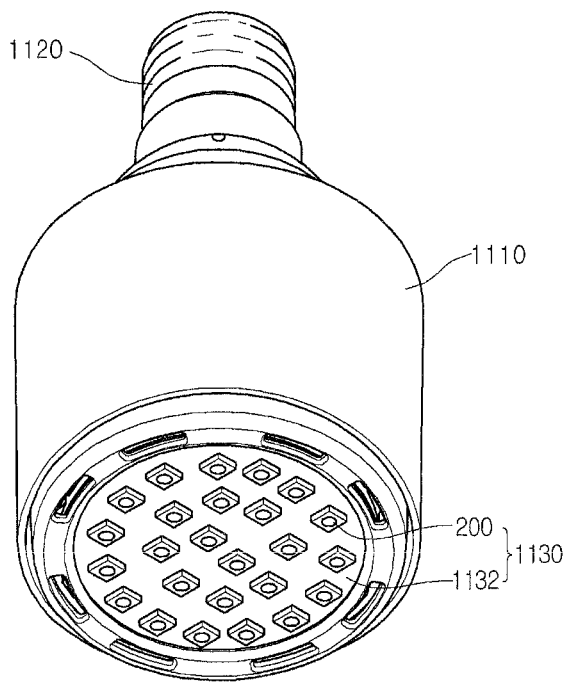
FIG. 11 is a view illustrating a lighting system using a light emitting device according to an embodiment.

FIG. 11 is a perspective view illustrating a lighting unit 1100 using light emitting device packages 200 according to an embodiment. The light unit of FIG. 11 is an example of lighting units. That is, the spirit and scope of the present disclosure is not limited thereto.

Referring to FIG. 11, the lighting unit 1100 may include a case body 1110, a light emitting module part 1130 disposed in the case body 1110, and a connection terminal 1120 disposed on the case body 1110 to receive power from an external power supply.

The case body 1110 may be formed of a material having good heat dissipation characteristics, such as a metal material or a resin material.

The light emitting module part 1130 may include a substrate 1132 and at least one light emitting device package 200 of the above-described embodiment. The light emitting device package 200 may be disposed on the substrate 1132.

The substrate 1132 may be a substrate in which circuit patterns are printed on an insulator. Examples of the substrate 1132 may include a general printed circuit board (PCB), a metal core PCB, a flexible PCB, and a ceramic PCB.

In addition, the substrate 1132 may be formed of a material capable of efficiently reflecting light. Alternatively, the substrate 1132 may have a surface having a color capable of efficiently reflecting light, such as a white color, or a silver color.

The at least one light emitting device package 200 may be disposed on the substrate 1132. The light emitting device package 200 may include at least one light emitting diode (LED). The LED may include a color diode capable of emitting color such as red, green, blue, or white light, and an ultraviolet (UV) LED capable of emitting a UV ray.

The light emitting module part 1130 may include a combination of various light emitting devices to obtain desired color tone and brightness. For example, the light emitting module part 1130 may include a combination of a white LED, a red LED, and a green LED to secure a high color rendering index (CRI).

The connection terminal 1120 may be electrically connected to the light emitting module part 1130 to supply power. As shown in FIG. 11, the connection terminal 1120 may be screwed and coupled to a socket of an external power source, but is not limited thereto. For example, the connection terminal 1120 may be formed in a pin shape. In this case, the connection terminal 1120 may be inserted into an external power source or connected to the external power source by using a cable.

In addition, the terms "first" and "second" can be selectively or exchangeably used for the members. In the figures, a dimension of each of elements may be exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted. Also, in the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer is referred to as being 'under/below/lower' each layer (film), the region, the pattern, or the structure, it can be directly under another layer (film), another region, another pad, or another patterns, or one or more intervening layers may also be present. Therefore, meaning thereof should be judged according to the spirit of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support member;
a reflection layer provided on the conductive support member;
an ohmic contact layer provided on the reflection layer and having a bottom surface, wherein the ohmic contact layer has a thickness of substantially 80 nm to 120 nm;
a light emitting structure comprising a first conductive type semiconductor layer, an active layer, and a second conductive type semiconductor layer that are coupled to the ohmic contact layer; and
an electrode provided on the first conductive type semiconductor layer, wherein the bottom surface of the ohmic contact layer has a surface roughness corresponding to a root mean square (RMS) value substantially in a range from 1 nm to 3 nm and wherein at least one part of an upper surface of the ohmic contact layer is in direct contact with the second conductive type semiconductor layer.

2. The light emitting device according to claim 1, wherein the reflection layer comprises aluminum (Al) or silver (Ag).

3. The light emitting device according to claim 1, wherein the light emitting structure emits light having a wavelength substantially in a range from 400 nm to 650 nm, and the reflection layer has a reflectance of about 75% or higher.

4. The light emitting device according to claim 1, wherein the root mean square (RMS) value of the ohmic contact layer increases or decreases relative to the thickness of the ohmic contact layer.

5. The light emitting device according to claim 1, wherein the light emitting structure emits light having a wavelength substantially in a range from 500 nm to 650 nm, and the reflection layer has a reflectance of about 80% or higher.

6. A light emitting device comprising:
a conductive support member;
a reflection layer provided on the conductive support member;
an ohmic contact layer provided on the reflection layer and having a bottom surface, wherein the ohmic contact layer has a thickness of substantially 180 nm to 220 nm;
a light emitting structure comprising a first conductive type semiconductor layer, an active layer, and a second conductive type semiconductor layer that are coupled to the ohmic contact layer; and
an electrode provided on the first conductive type semiconductor layer,
wherein the bottom surface of the ohmic contact layer has a surface roughness corresponding to a root mean square (RMS) value substantially in a range from 3 nm to 5 nm and wherein at least one part of an upper surface of the ohmic contact layer is in direct contact with the second conductive type semiconductor layer.

7. The light emitting device according to claim 6, wherein the reflection layer comprises aluminum (Al).

8. The light emitting device according to claim 6, wherein the light emitting structure emits light having a wavelength substantially in a range from 400 nm to 650 nm, and the reflection layer has a reflectance of about 75% or higher.

9. The light emitting device according to claim 6, wherein the reflection layer comprises silver (Ag).

10. The light emitting device according to claim 6, wherein the light emitting structure emits light having a wavelength substantially in a range from 530 nm to 650 nm, and the reflection layer has a reflectance of about 80% or higher.

11. The light emitting device of claim 6, wherein the reflection layer is between the ohmic contact layer and the upper surface of the conductive support member.

12. A light emitting device comprising:
a support member;
a first layer having metal material provided on the support member;
a second layer having metal material provided on the first layer;
a light emitting structure comprising a first conductive type semiconductor layer, an active layer, and a second conductive type semiconductor layer; and
an electrode provided on the light emitting structure, wherein the second layer has a surface roughness corresponding to a root mean square (RMS) value substantially in a range from 1 nm to 5 nm,
wherein at least one part of the second layer is in contact with the light emitting structure, and
wherein the second layer has a thickness of substantially 80 nm to 120 nm or 180 nm to 220 nm.

13. The light emitting device according to claim 12, wherein the first layer comprises aluminum (Al) or silver (Ag).

14. The light emitting device according to claim 12, wherein the light emitting structure emits light having a wavelength substantially in a range from 400 nm to 650 nm, the surface roughness of the second layer is substantially in the range from 1 nm to 3 nm in RMS value and wherein the second layer has the thickness of substantially 80 nm to 120 nm.

15. The light emitting device according to claim 12, wherein the light emitting structure emits light having a wavelength substantially in a range from 500 nm to 650 nm, the surface roughness of the second layer is substantially in the range from 1 nm to 3 nm in RMS value and the second layer has the thickness of substantially 80 nm to 120 nm.

16. The light emitting device according to claim 12, wherein the light emitting structure emits light having a wavelength substantially in a range from 400 nm to 650 nm, the surface roughness of the second layer is substantially in the range from 3 nm to 5 nm in RMS value and the second layer has the thickness of substantially 180 nm to 220 nm.

17. The light emitting device according to claim 12, wherein the light emitting structure emits light having a wavelength substantially in a range from 530 nm to 650 nm, the surface roughness of the second layer is substantially in the range from 3 nm to 5 nm in RMS value and the second layer has the thickness of substantially 180 nm to 220 nm.

18. The light emitting device according to claim 12, wherein the first layer has a reflective material with a reflectance of about 80% or higher and the second layer has the thickness of substantially 80 nm to 120 nm.

19. The light emitting device according to claim 12, wherein the first layer has a reflective material with a reflectance of about 75% or higher and the second layer has the thickness of substantially 180 nm to 220 nm.

20. The light emitting device according to claim 12, wherein the second layer has a ohmic contact layer.

* * * * *